United States Patent
Otake et al.

(10) Patent No.: US 8,618,584 B2
(45) Date of Patent: Dec. 31, 2013

(54) SEMICONDUCTOR DEVICE

(75) Inventors: Seiji Otake, Kumagaya (JP); Yasuhiro Takeda, Ora-gun (JP); Yuta Miyamoto, Ora-gun (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 13/612,224

(22) Filed: Sep. 12, 2012

(65) Prior Publication Data

US 2013/0075865 A1    Mar. 28, 2013

(30) Foreign Application Priority Data

Sep. 27, 2011  (JP) ................................. 2011-210199

(51) Int. Cl.
   *H01L 21/70*   (2006.01)
   *H01L 23/62*   (2006.01)

(52) U.S. Cl.
   USPC ........... 257/273; 257/499; 257/511; 257/355; 257/E27.017; 257/E27.019

(58) Field of Classification Search
   USPC ......... 257/273, 175, 355, 361, 362, 452, 499, 257/511, 517, 526, 528, 539, 546, 547, 551, 257/552, 557, 565, 575, E27.001, E27.015, 257/E27.017, E27.019, E27.023, E27.043, 257/E27.037, E27.072, E27.074, E29.001, 257/E29.169
   See application file for complete search history.

(56) References Cited

U.S. PATENT DOCUMENTS

| | | | |
|---|---|---|---|
| 6,765,771 B2 * | 7/2004 | Ker et al. | 361/56 |
| 7,202,531 B2 * | 4/2007 | Imahashi et al. | 257/355 |
| 7,253,456 B2 * | 8/2007 | Jensen | 257/199 |
| 8,093,683 B2 * | 1/2012 | Shimamura | 257/552 |
| 8,304,827 B2 * | 11/2012 | Nakamura et al. | 257/328 |

FOREIGN PATENT DOCUMENTS

| | | |
|---|---|---|
| JP | 5-90481 | 4/1993 |
| JP | 6-177328 | 6/1994 |
| JP | 2006-128293 | 5/2006 |

OTHER PUBLICATIONS

Otake et al., U.S. Office Action mailed Sep. 12, 2013, directed to U.S. Appl. No. 13/612,194; 7 pages.

* cited by examiner

*Primary Examiner* — Cuong Q Nguyen
*Assistant Examiner* — Galina Yushina
(74) *Attorney, Agent, or Firm* — Morrison & Foerster LLP (57) ABSTRACT

An ESD protection element is formed by a PN junction diode including an N+ type buried layer having a proper impurity concentration and a first P+ type buried layer and a parasitic PNP bipolar transistor which uses a second P+ type buried layer connected to a P+ type diffusion layer as the emitter, an N− type epitaxial layer as the base, and the first P+ type buried layer as the collector. The first P+ type buried layer is connected to an anode electrode, and the P+ type diffusion layer and an N+ type diffusion layer surrounding the P+ type diffusion layer are connected to a cathode electrode. When a large positive static electricity is applied to the cathode electrode, and the parasitic PNP bipolar transistor turns on to flow a large discharge current.

6 Claims, 6 Drawing Sheets

SEMICONDUCTOR DEVICE

CROSS-REFERENCE OF THE INVENTION

This application claims priority from Japanese Patent Application No. 2011-210199, filed Sep. 27, 2011; the content of which is incorporated herein by reference in its entirety.

BACKGROUND OF THE INVENTION

1. Field of the Invention

The invention relates to a semiconductor device, in particular, a semiconductor device including an ESD protection element having a high ESD protection characteristic.

2. Description of the Related Art

Figure 5:
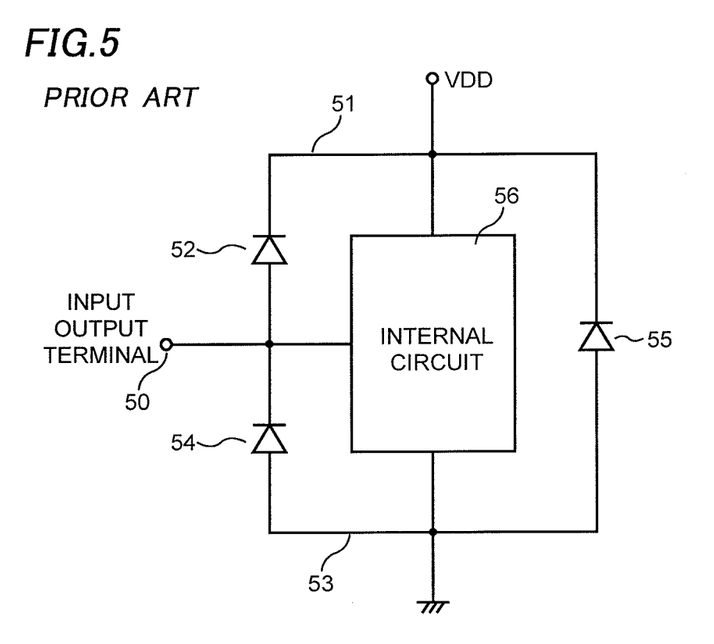
FIG. 5 is a circuit diagram of an ESD protection circuit using an ordinary PN junction diode as a conventional ESD protection element.

Conventionally, for addressing ESD, various types of semiconductor devices having protection circuits for the semiconductor devices are proposed. For example, typically as shown in FIG. 5, an internal circuit 56 is protected by connecting a PN junction diode 52 between an input output terminal 50 and a power supply line 51, connecting a PN junction diode 54 between the input output terminal 50 and a ground line 53, and connecting a PN junction diode 55 between the power supply line 51 and the ground line 53. The ESD is an abbreviation of Electro-Static Discharge and means the discharge of static electricity.

However, as the miniaturization of elements is enhanced for a demand for higher speed and so on, the electrostatic breakdown tolerance of a semiconductor device is decreased and thus a more proper ESD protection element is essential. Japanese Patent Application Publication No. 2006-128293 discloses a BiCMOS type integrated circuit including a MOS type transistor as a high breakdown voltage element and an NPN bipolar transistor as a low breakdown voltage element, which uses the low breakdown voltage NPN transistor as the ESD protection element, its problem, and a means of solving the problem.

Furthermore, Japanese Patent Application Publication No. Hei 05-90481 discloses using an NPN bipolar transistor between a power supply line and a ground line as an ESD protection element instead of using a PN junction diode, in which the base and emitter are connected by a resistor. Japanese Patent Application Publication No. Hei 06-177328 discloses using a MOS type transistor as an ESD protection element of which the snapback voltage is decreased so as to enhance the ESD protection characteristic.

Although details will be described below, the snapback voltage means a trigger voltage to start discharging static electricity to a ground line when a surge voltage by large static electricity is applied to an input output terminal or the like. When the snapback voltage of a protection element is lower than the snapback voltage of an element to be protected, static electricity is discharged to the ground line through the protection element, and the element to be protected is protected from the static electricity.

Figure 6:
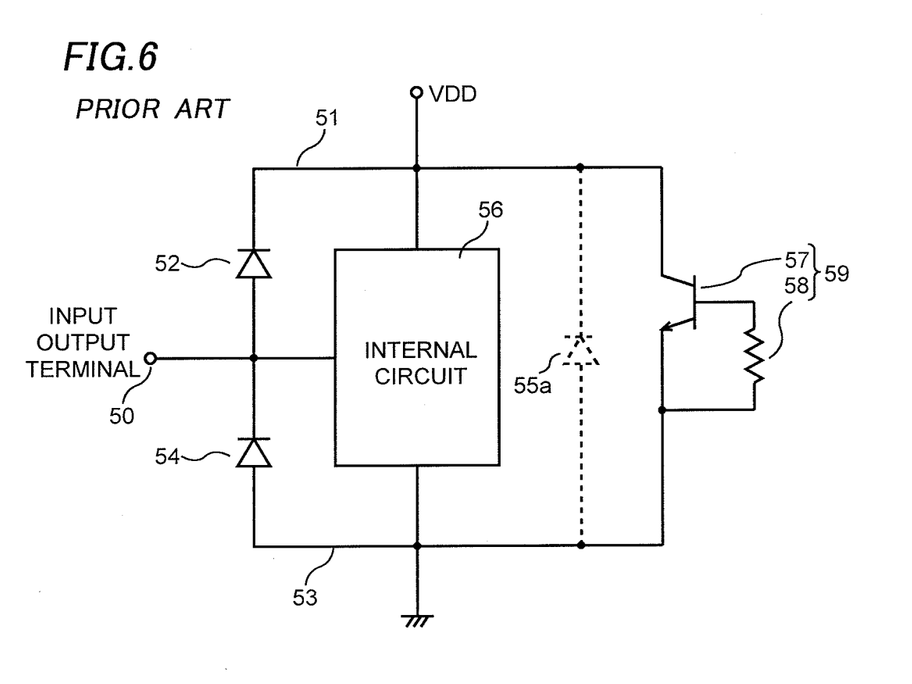
FIG. 6 is a circuit diagram of an ESD protection circuit using an additional ESD protection element formed by an NPN bipolar transistor and a resistor as well as an ordinary PN junction diode as a conventional ESD protection element.

Japanese Patent Application Publication No. Hei 05-90481 discloses an additional ESD protection element 59 as shown in FIG. 6 in the same structure as the structure shown in FIG. 5 for a case in which static electricity is applied between a highest potential terminal as a power supply line 51 and a lowest potential terminal as a ground line 53. Conventionally, a parasitic PN junction diode 55a shown by a dotted line which uses the N type epitaxial layer as the cathode and uses the P type semiconductor substrate as the anode becomes a discharge path of static electricity applied between both the terminals and protects an internal circuit 56. The parasitic PN junction diode 55a is a replacement of the PN junction diode 55 in FIG. 5.

However, since the enhancement of miniaturization and so on cause the increase of the impedance of the discharge path of static electricity and so on, the parasitic PN junction diode 55a does not effectively work and a discharge path of static electricity occurs through some junction in the internal circuit 56, thereby causing a problem of breaking the junction in the internal circuit 56. Therefore, for addressing static electricity, the additional ESD protection element 59 is provided in which an NPN bipolar transistor 57 of which the base and emitter are shunted by a resistor 58 is connected in parallel with the parasitic PN junction diode 55a.

When a positive voltage by static electricity is applied from the power supply line 51 to the collector of the NPN bipolar transistor 57 connected to the power supply line 51 and a negative voltage is applied from the ground line 53 to the emitter connected to the ground line 53, the NPN bipolar transistor 57 breaks down at the time when the voltage reaches a collector-emitter breakdown voltage $BV_{CER}$ or more in the state where the resistor 58 is connected between the base and emitter of the NPN bipolar transistor 57.

On the contrary, when static electricity is applied as a negative voltage to the power supply line 51 and as a positive voltage to the ground line 53, the base-collector junction is forward-biased through the resistor 58 and clamped.

Therefore, the internal circuit 56 between the power supply line 51 and the ground line 53 is protected from static electricity by the additional ESD protection element 59 which is formed by the NPN bipolar transistor 57 and the resistor 58, is connected in parallel with the conventional parasitic ESD protection PN junction diode 55a, and has a lower breakdown voltage. A portion of the discharge path of static electricity lies inside the semiconductor substrate, and other portion lies on the surface of the semiconductor substrate.

However, a semiconductor device used in a mobile phone or the like which requires a lower voltage operation needs other ESD protection element which breaks down by a still lower voltage and forms a static electricity discharge path such that a more portion of the path lies inside the semiconductor substrate for heat radiation when static electricity is applied.

SUMMARY OF THE INVENTION

The invention provides a semiconductor device including: a semiconductor substrate of a first general conductivity type; an epitaxial layer of a second general conductivity type formed on the semiconductor substrate; a first buried layer of the second general conductivity type formed between the semiconductor substrate and the epitaxial layer; a second buried layer of the first general conductivity type connected to a peripheral edge region of the first buried layer and extending from inside the semiconductor substrate into the epitaxial layer; a third buried layer of the first general conductivity type connected to a center region of the first buried layer and extending from top and bottom surface portions of the first buried layer into the epitaxial layer and the semiconductor substrate respectively; a first drawing layer and a second drawing layer of the first general conductivity type each extending from a surface portion of the epitaxial layer into the epitaxial layer so as to be connected to the second buried layer and the third buried layer respectively; a first diffusion layer of the first general conductivity type extending from a surface portion of the epitaxial layer into the epitaxial layer and connected to the second drawing layer so as to be surrounded by the second buried layer and the first drawing layer in plan view of the semiconductor substrate, the first buried layer covering a bottom portion of the first diffusion layer; a second diffusion layer of the second general conductivity type connected to and surrounding the first diffusion layer in the plan view; a cathode electrode connected to the first diffusion layer and the second diffusion layer; and an anode electrode connected to the first drawing layer, wherein the first buried layer and the second buried layer are configured to form a PN junction diode, the third buried layer, the epitaxial layer and the second buried layer are configured to form a parasitic bipolar transistor, and the PN junction diode and the parasitic bipolar transistor are configured to form an ESD protection element.

DETAILED DESCRIPTION OF THE INVENTION

Figure 1A:
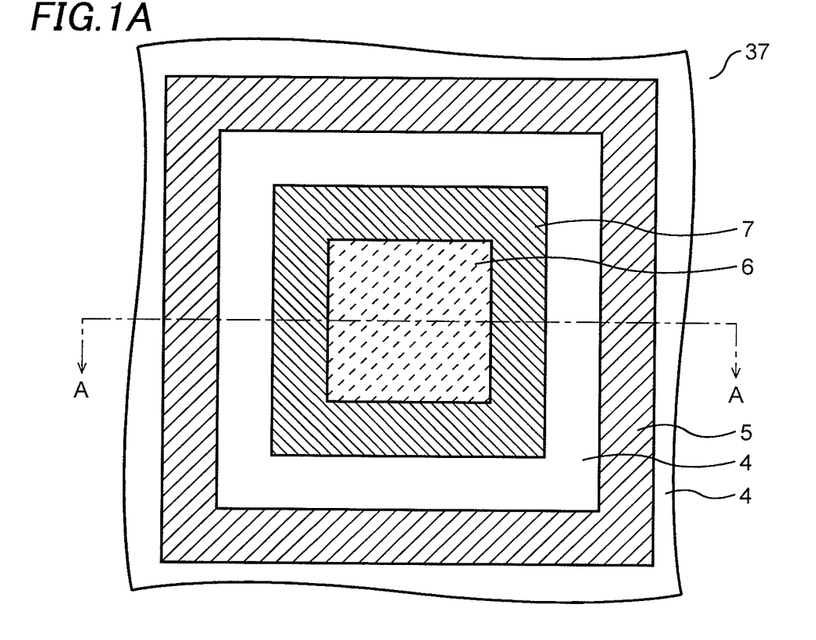
FIGS. 1A and 1B are a plan view of an ESD protection element of an embodiment of the invention and a cross-sectional view schematically showing a method of manufacturing the ESD protection element and the discharge path of static electricity.
Figure 1B:
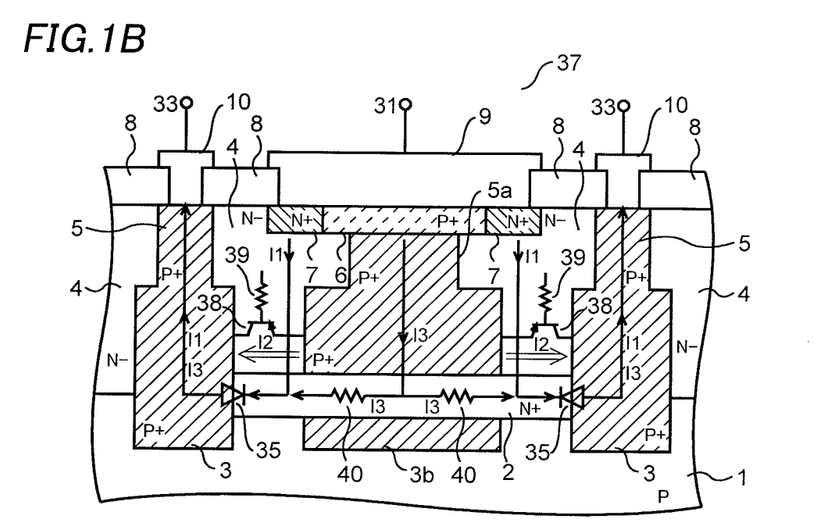

The feature of an ESD protection element 37 used in a semiconductor device of an embodiment will be described below referring to FIGS. 1A, 1B, 2A and 2B. FIG. 1A is a plan view of the ESD protection element 37 of the embodiment. FIG. 1B is a cross-sectional view of FIG. 1A along line A-A, and also a schematic diagram of the discharge path of static electricity. It is noted that a cathode electrode 9 and an anode electrode 10 shown in FIG. 1B are omitted in FIG. 1A.

Figure 2A:
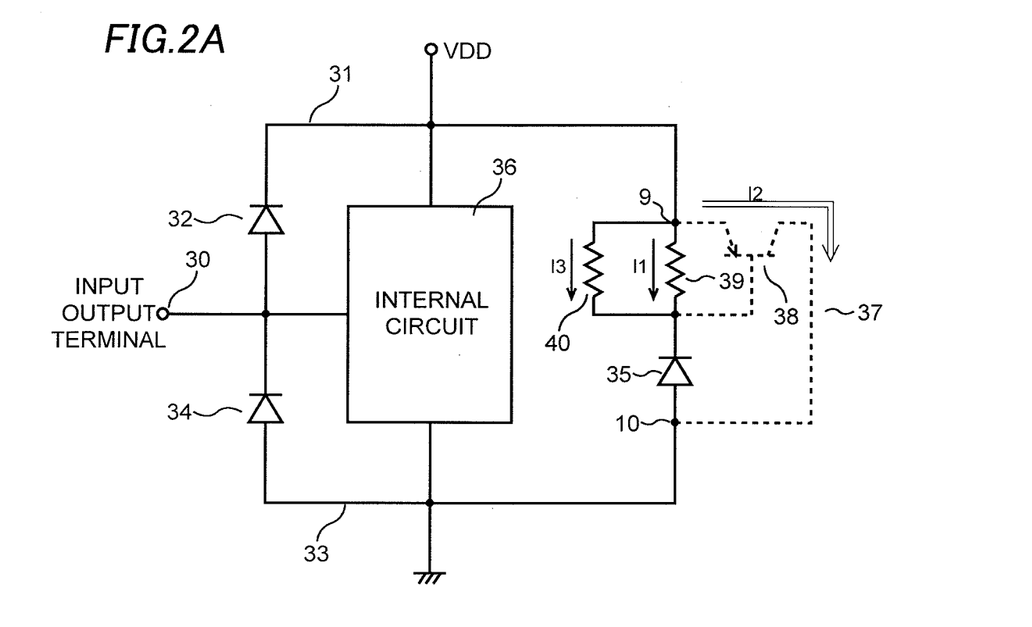
FIGS. 2A and 2B are a circuit diagram of an ESD protection circuit using the ESD protection element of the embodiment of the invention and a graph showing a relation of a voltage of static electricity applied to the ESD protection element and a discharge current.

FIG. 2A is a circuit diagram of an ESD protection circuit in which the ESD protection element 37 of the embodiment is connected between a power supply line 31 and a ground line 33. An internal circuit 36 is connected between the power supply line 31 and the ground line 33. An input output terminal 30 is drawn from the internal circuit 36, and a PN junction diode 32 is connected between the input output terminal 30 and the power supply line 31 and a PN junction diode 34 is connected between the input output terminal 30 and the ground line 33 as ESD protection elements. It is noted that the PN junction diodes 32 and 34 may be replaced by the structure of the ESD protection element 37.

The ESD protection element 37 is formed by a PN junction diode 35, a resistor 39, a resistor 40 and a parasitic PNP bipolar transistor 38 shown by a dotted line, as shown in FIG. 2A. As shown in FIG. 1B, the PN junction diode 35 is formed by an N+ type buried layer 2 and a P+ type buried layer 3.

The resistor 39 is formed by the resistance of an N− type epitaxial layer 4. The resistor 40 is formed by the resistances of a P+ type diffusion layer 6, a P+ type drawing layer 5a, a P+ type buried layer 3b, the N+ type buried layer 2 and so on. The parasitic PNP bipolar transistor 38 is formed by the P+ type buried layer 3b as the emitter which is connected to the P+ type diffusion layer 6 through the P+ type drawing layer 5a, the N− type epitaxial layer 4 as the base, and the P+ type buried layer 3 as the collector. It is noted that conductivity types such as N+, N and N− belong in one general conductivity type and conductivity types such as P+, P and P− belong in the other general conductivity type.

The structure of the ESD protection element 37 will be described in more detail referring to FIGS. 1A and 1B, and then the discharge path of static electricity applied to the ESD protection element 37 will be described. As shown in FIG. 1B, the N+ type buried layer 2 and the P+ type buried layer 3 are connected to each other on the P type semiconductor substrate 1, and form the PN junction diode 35.

The impurity concentration of the N+ type buried layer 2 at least in a region adjacent to the PN junction is higher than the concentration of the N− type epitaxial layer 4, but lower than the concentrations of a high concentration N+ type buried layer as the collector layer of an ordinary NPN bipolar transistor and the P+ type buried layer 3 of the embodiment. This is to set the breakdown voltage of the PN junction diode 35 formed by the N+ type buried layer 2 and the P+ type buried layer 3 to a desired value.

The P+ type buried layer 3 and the P+ type drawing layer 5 are combined and penetrate the N− type epitaxial layer 4, and are connected to the anode electrode 10 connected to the ground line 33 as shown in the two positions on the left and right sides in FIG. 1B. In the center position in FIG. 1B, the P+ type buried layer 3b extends from top and bottom surface portions of the first buried layer 2 into the epitaxial layer 4 and the semiconductor substrate 1 respectively. The P+ type buried layer 3b is combined with the P+ type drawing layer 5a and connected to the cathode electrode 9 through the P+ type diffusion layer 6.

The P+ type diffusion layer 6 and an N+ type diffusion layer 7 adjacent to the P+ type diffusion layer 6 are formed from a surface portion of the N− type epitaxial layer 4 surrounded by the P+ type buried layer 3 and the P+ type drawing layer 5 which are shown on the left and right sides in FIG. 1B, and the N+ type buried layer 2.

As shown in FIG. 1A, in the N− type epitaxial layer 4 surrounded by the P+ type drawing layer 5 etc, the P+ type diffusion layer 6 is formed, and the N+ type diffusion layer 7 is formed adjacent to the P+ type diffusion layer 6 so as to surround the P+ type diffusion layer 6. As shown in FIG. 1B, the N+ type diffusion layer 7 is formed so as to have the same depth as the P+ type diffusion layer 6 from the surface of the N− type epitaxial layer 4.

The anode electrode 10 connected to the P+ type drawing layer 5 and the cathode electrode 9 connected to the N+ type diffusion layer 7 and the P+ type diffusion layer 6 are formed through the openings of an insulation film 8 made of a silicon oxide film or the like formed on the surface of the P type semiconductor substrate 1 including on the N+ type diffusion layer 7. The cathode electrode 9 is connected to the power supply line 31.

A discharge current and the discharge path of the discharge current when static electricity is applied to the ESD protection element 37 of the embodiment will be described hereafter referring to FIGS. 1B, 2A and 2B.

When a surge voltage by positive static electricity is applied to the power supply terminal $V_{DD}$ shown in FIG. 2A, the surge voltage by the positive static electricity is applied to the N+ type buried layer 2 from the power supply line 31 connected to the power supply terminal $V_{DD}$ through the cathode electrode 9, the N+ type diffusion layer 7 and the N− type epitaxial layer 4 as shown in FIG. 1B. On the other hand, the anode electrode 10 connected to the ground line 33, and the P+ type drawing layer 5 and the P+ type buried layer 3 connected to the anode electrode 10 have the ground potential.

Therefore, when the surge voltage by the positive static electricity is larger than the breakdown voltage of the PN junction diode 35 formed by the N+ type buried layer 2 and the P+ type buried layer 3, the PN junction diode 35 breaks down. This is because the breakdown voltage of the PN junction diode 35 is smaller than the breakdown voltage of the device forming the internal circuit 36 by setting the impurity concentration of the N+ type buried layer 2 higher than the impurity concentration of the N− type epitaxial layer 4 and lower than the impurity concentration of the adjacent P+ type buried layer 3.

As a result, as shown in FIG. 1B, a discharge current I1 flows from the N+ type diffusion layer 7 into the anode electrode 10 through the N− type epitaxial layer 4 having a resistance component, the N+ type buried layer 2, the P+ type buried layer 3 and the P+ type drawing layer 5. To describe this with FIG. 2B, the PN junction diode 35 breaks down at the voltage a, and the discharge current I1 flows with a gradient corresponding to the resistance of the N− type epitaxial layer 4 etc until it reaches the voltage b.

When the discharge current I1 flows through the N− type epitaxial layer 4 as the resistor 39, a potential gradient occurs in the N− type epitaxial layer 4, and the potential of the P+ type drawing layer 5a and the P+ type buried layer 3b connected to the high potential cathode electrode 9 through the P+ type diffusion layer 6 becomes higher than the potential of the N− type epitaxial layer 4. This potential difference becomes larger in a more adjacent region to the N+ type buried layer 2, and is largest between the P+ type buried layer 3b immediately above the N+ type buried layer 2 and the N− type epitaxial layer 4 adjacent thereto.

Therefore, the parasitic PNP bipolar transistor 38, which uses the P+ type buried layer 3b connected to the P+ type diffusion layer 6 through the P+ type drawing layer 5a as the emitter, the N− type epitaxial layer 4 as the base, and the P+ type buried layer 3 shown on the left and right sides in FIG. 1B as the collector, turns on. It is preferable that the width of the N− type epitaxial layer 4 between the P+ type buried layer 3b and the P+ type buried layer 3, which is the base width of the parasitic PNP bipolar transistor 38, is formed as small as possible so as to obtain a high current amplification and a large on current as long as a desired breakdown voltage is secured.

When the potential difference between the P+ type buried layer 3b as the emitter and the N− type epitaxial layer 4 as the base adjacent thereto reaches a predetermined value or more, the parasitic PNP bipolar transistor 38 turns on in the whole region between the P+ type buried layer 3b and the P+ type buried layer 3 instead of only in a portion immediately above the N+ type buried layer 2. Therefore, the on current becomes large.

A large discharge current I2 as the on current flows through the on-state parasitic PNP bipolar transistor 38 from the P+ type buried layer 3b as the emitter toward the P+ type buried layer 3 as the collector as shown in FIG. 1B. Additionally, by the breakdown of the PN junction diode 35, a discharge current I3 also flows from the cathode electrode 9 into the anode electrode 10 through the relatively low resistances of the P+ type diffusion layer 6, the P+ type drawing layer 5a, the P+ type buried layer 3b, the N+ type buried layer 2, the P+ type buried layer 3 and the P+ type drawing layer 5.

By the large discharge current I2 flowing through the parasitic PNP bipolar transistor 38, the positive static electricity entering the cathode electrode 9 from the power supply line 31 flows from the P+ type buried layer 3b into the ground line 33 through the N− type epitaxial layer 4, P+ type buried layer 3, the P+ type drawing layer 5 and the anode electrode 10. Furthermore, the discharge current I3 described above also contributes to the discharge of the positive static electricity. As a result, the internal circuit 36 is protected from the static electricity immediately.

Figure 2B:
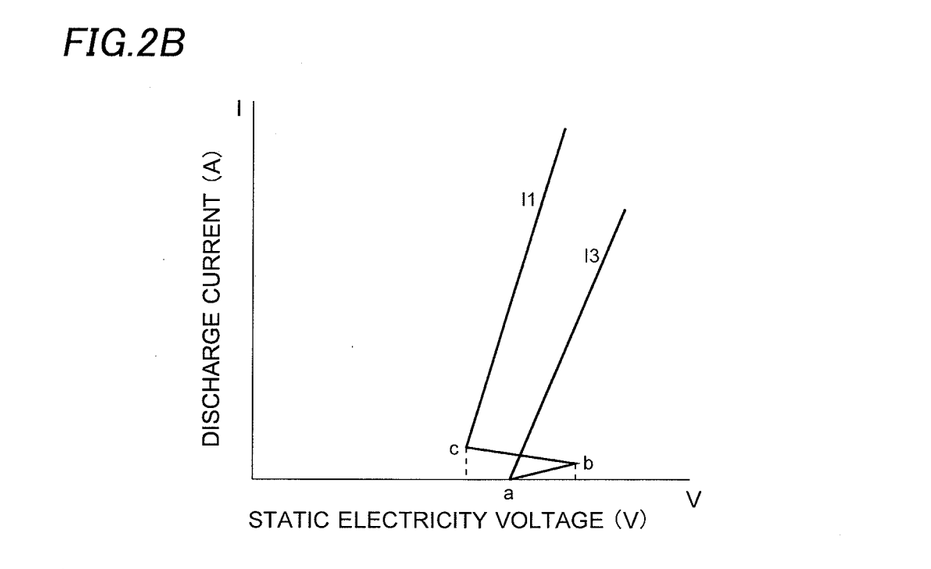

To describe this with FIG. 2B, at the time when the discharge current I1 flows and the voltage of the cathode electrode 9 reaches the voltage b, i.e., at the time when the potential difference between the P+ type buried layer 3b and the N− type epitaxial layer 4 reaches a predetermined value, the parasitic PNP bipolar transistor 38 turns on.

The snapback phenomenon occurs at this time, then the collector-emitter voltage $V_{CE}$ of the parasitic PNP bipolar transistor 38 decreases to the voltage c, and then the discharge current I2 increases with a gradient corresponding to the collector resistance of the parasitic PNP bipolar transistor 38 etc. The voltage c substantially corresponds to $BV_{CER}$ which is the breakdown voltage of the parasitic bipolar transistor 38 when the emitter and base are shunted by a resistor R. At the same time as when the PN junction diode 35 breaks down and the discharge current I1 starts flowing, the discharge current I3 also flows through the resistor 40 having a relatively low resistance.

To describe this with FIG. 2A, in the ESD protection element 37, first, the PN junction diode 35 breaks down due to the surge voltage by the positive static electricity applied to the PN junction diode 35 from the power supply line 31 through the cathode electrode 9 and the resistor 39, and the discharge current I1 flows between the power supply line 31 and the ground line 33.

As a result, a voltage decrease occurs at the resistor 39 and the base potential of the parasitic PNP bipolar transistor 38 decreases to become lower than the emitter potential, and thus the parasitic PNP bipolar transistor 38 turns on to flow the large discharge current I2 from the power supply line 31 into the ground line 33. Furthermore, by the breakdown of the PN junction diode 35, the discharge current I3 also flows through the resistor 40 having a relatively low resistance.

As described above, the ESD protection element 37 of the embodiment realizes a desired breakdown voltage of the PN junction diode 35 by forming the PN junction diode 35 using the N+ type buried layer 2 having a predetermined impurity concentration and the P+ type buried layer 3, turns on the parasitic PNP bipolar transistor 38 by the discharge current I1 by the breakdown of the PN junction diode 35 to flow the large discharge current I2, and further flows the discharge current I3 through the resistor 40 having a relatively low resistance.

Furthermore, since the discharge current I2 flows in a region near the P type semiconductor substrate 1 which is on the bottom side of the semiconductor device, the heat radiation effect is enhanced and the discharge current I2 is able to flow more. Therefore, the ESD protection element of the embodiment protects the internal circuit 36 from static electricity immediately.

Hereafter, a method of manufacturing the ESD protection element of the embodiment will be briefly described referring to FIGS. 1B, 3A, 3B, 3C, 4A and 4B. Basically, the method is the same as a method of manufacturing a bipolar integrated circuit.

Figure 3A:
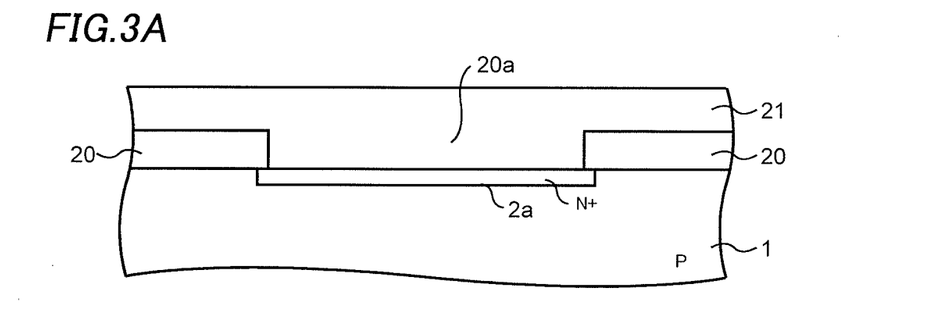
FIGS. 3A, 3B and 3C are cross-sectional views showing the method of manufacturing the ESD protection element of the embodiment of the invention.

First, as shown in FIG. 3A, the P type semiconductor substrate 1 is provided, and an insulation film 20 made of a silicon thermal oxide film or the like is formed on the surface. Then a predetermined size of opening 20a is formed in the insulation film 20 by a predetermined photo-etching process, and an antimony (Sb) doped coating film 21 is formed so as to cover the P type semiconductor substrate 1 including the opening 20a under the same condition as the condition for forming an N+ type buried layer in an ordinary bipolar process.

Then a heat treatment is performed to form an N+ type buried deposition layer 2a in the P type semiconductor substrate 1. The N+ type buried deposition layer 2a may be formed by ion-implanting antimony (Sb) instead of using the coating film 21.

Figure 3B:
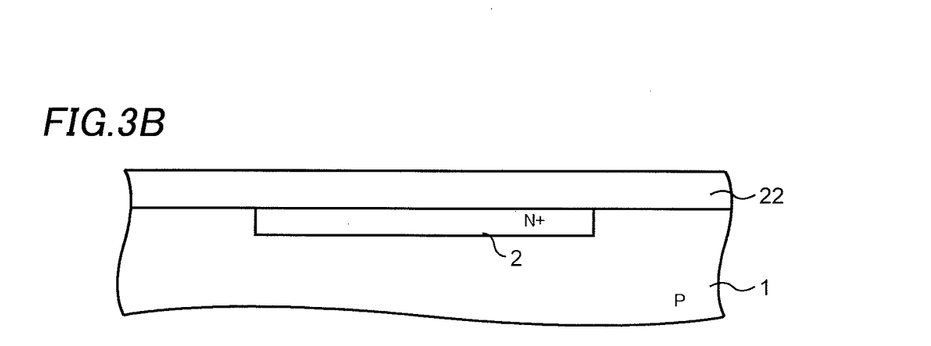

Then, as shown in FIG. 3B, after the coating film 21 is removed, a heat treatment is performed at temperature of about 1100° C. so as to diffuse the N+ type buried deposition layer 2a in the P type semiconductor substrate 1 in the lateral direction and in the downward direction into a deeper region, thereby forming the N+ type buried layer 2. The shape of the N+ type buried layer 2 in the P type semiconductor substrate 1 is mostly determined by this heat treatment. At this time, a silicon oxide film 22 is formed on the P type semiconductor substrate 1 including on the N+ type buried layer 2.

Figure 3C:
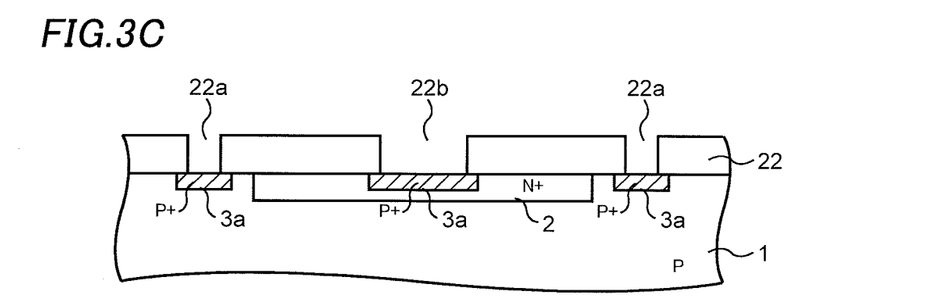

Then, as shown in FIG. 3C, openings 22a and 22b are formed in the silicon oxide film 22 by a predetermined photo-etching process, and boron (B) or the like is ion-implanted or the like in the P type semiconductor substrate 1 etc exposed in the openings 22a and 22b using the silicon oxide film 22 etc as a mask, thereby forming a P+ type buried deposition layer 3a. The opening 22b has a larger width than the opening 22a. This is to provide the parasitic PNP bipolar transistor 38 with a high current amplification by decreasing the distance between the P+ type buried layer 3b and the P+ type buried layer 3 described above.

Figure 4A:
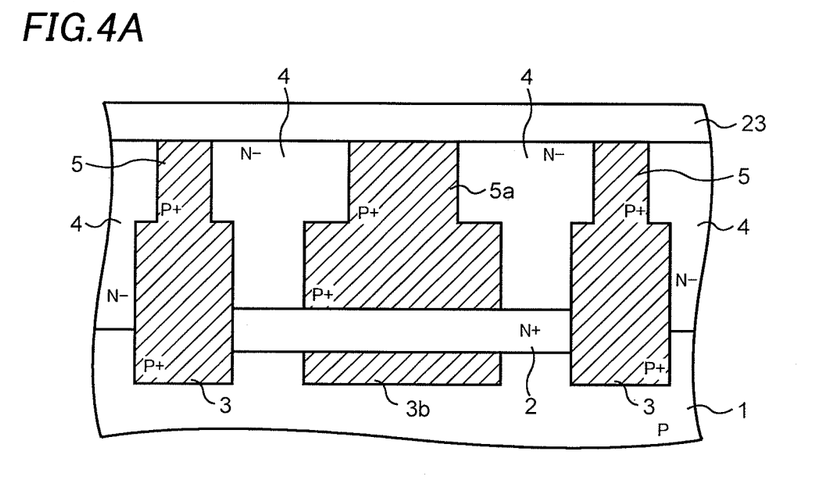
FIGS. 4A and 4B are cross-sectional views showing the method of manufacturing the ESD protection element of the embodiment of the invention.

Then, as shown in FIG. 4A, after the silicon oxide film 22 is removed, the N− type epitaxial layer 4 is deposited on the P type semiconductor substrate 1 including on the N+ buried layer 2 etc by a predetermined epitaxial method.

Then boron (B) or the like is ion-implanted in a predetermined position of the N− type epitaxial layer 4 using a silicon oxide film or the like formed on the surface of the N− type epitaxial layer 4 as a mask, and a predetermined heat treatment is performed to form the combined P+ type buried layer 3 and P+ type drawing layer 5 and the combined P+ type buried layer 3b and the P+ type drawing layer 5a, which penetrate the N− type epitaxial layer 4 as shown in FIG. 4A.

By the deposition of the N− type epitaxial layer 4 and the heat treatment after the deposition described above, the N+ type buried layer 2 is thermally diffused in the N− type epitaxial layer 4 to extend in the upward and lateral directions. However, the amount of the diffusion is small since the diffusion coefficient of antimony (Sb) or the like which is the impurity of the N+ type buried layer 2 is small. An insulation film 23 made of a silicon oxide film or the like is formed on the N− type epitaxial layer 4 including on the P+ type drawing layer 5.

The P+ type buried layer 3 diffused in the lateral direction at latest when the N− type epitaxial layer 4 is deposited or the heat treatment is performed after the deposition is connected to the end portion of the N+ type buried layer 2 having a low impurity concentration which is diffused in the lateral direction from the opening 20a shown in FIG. 3A in the P type semiconductor substrate 1 etc, thereby forming the PN junction diode 35 having a desired breakdown voltage.

In detail, in the PN junction diode 35, the impurity concentration of a portion of the N+ type buried layer 2 adjacent to the PN junction is adjusted to a proper concentration by adjusting the distance between the end portion of the opening 20a shown in FIG. 3A and the end portion of the opening 22a shown in FIG. 3C. As a result, when a reverse bias is applied to the PN junction diode 35, the depletion layer extends more widely toward the N+ type buried layer 2 having a low impurity concentration, achieving the desired breakdown voltage.

It is also possible that the PN junction diode 35 is formed by the N+ type buried layer 2 having a low impurity concentration and the P+ type buried layer 3 by designing a portion of the N+ type buried layer 2 disposed on the outside of the P+ type buried layer 3b and adjacent to the P+ type buried layer 3 so as to have an impurity concentration lower than the impurity concentration of an N+ type buried layer in an ordinary bipolar process and lower than the impurity concentration of the P+ type buried layer 3 and by forming the N+ type buried layer 2 so as to overlap the P+ type buried layer 3 by an ion implantation process or the like. The desired breakdown voltage of the PN junction diode 35 is realized by setting the impurity concentration of the N+ type buried layer 2 having a low impurity concentration in this region to a predetermined value.

Furthermore, it is also possible to form an N+ type buried layer having a high impurity concentration equivalent to the impurity concentration of an N+ type buried layer of an ordinary bipolar process in a region away from the P+ type buried layer 3, and then form the N+ type buried layer 2 having a low impurity concentration between the N+ type buried layer having the high impurity concentration and the P+ type buried layer 3 so as to connect these, thereby foaming the PN junction diode 35 by the N+ type buried layer 2 having the low impurity concentration and the P+ type buried layer 3. The P+ type buried layer 3b extends from top and bottom surface portions of the N+ type buried layer having the high impurity concentration into the epitaxial layer 4 and the semiconductor substrate 1 respectively.

In the embodiment, the misalignment of the masks for forming the opening 20a and the opening 22a may cause a variation of the breakdown voltages of the PN junction diodes 35. However, the case of forming the N+ type buried layer 2 overlapping the P+ type buried layer 3 by ion implantation or the like does not cause a phenomenon corresponding to the mask misalignment, and thus the variation of the breakdown voltages of the PN junction diodes 35 is moderated.

Figure 4B:
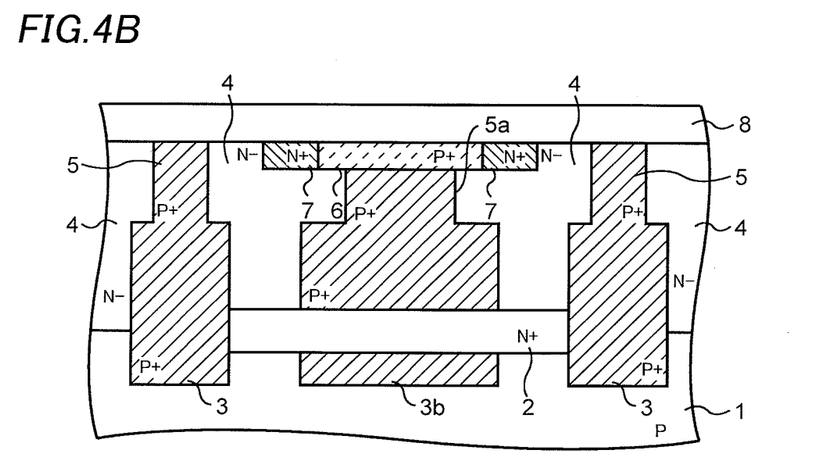

Then, as shown in FIG. 4B, the N+ type diffusion layer 7 and the P+ type diffusion layer 6 are formed sequentially by ion-implanting arsenic (As) or the like and boron (B) or the like using the insulation film 23 or a photoresist film as a mask by a predetermined method. This process is performed at the same time as when the emitter layer, the base contact layer, etc of an ordinary bipolar transistor are formed. The insulation film 8 made of a silicon oxide film or the like is formed on the P type semiconductor substrate 1 including on the N+ type diffusion layer 7 etc.

Then, as shown in FIG. 1B, the openings are formed in the insulation film 8 by a predetermined photo-etching process. Then the anode electrode 10 and the cathode electrode 9 are formed by performing a predetermined photo-etching process to a thin film made of aluminum (Al) or the like deposited by sputtering or the like. The anode electrode 10 is connected to the P+ type drawing layer 5 and the cathode electrode 9 is connected to the N+ type diffusion layer 7 and the P+ type diffusion layer 6 through the openings. A multi-layer wiring structure is then formed according to need, and finally a passivation film is formed, thereby completing the semiconductor device having the ESD protection element 37.

Although the description of the embodiment is given using one ESD protection element as shown in FIG. 1A etc, the same structures may be formed on the front, rear, left and right sides in these figures in a grid pattern so as to form an ESD protection element of which the discharge current I2 is further increased.

The invention realizes a semiconductor device having an ESD protection element with a high ESD protection characteristic which breaks down by a desired breakdown voltage and flows a large discharge current.

What is claimed is:

1. A semiconductor device comprising:
    a semiconductor substrate of a first general conductivity type;
    an epitaxial layer of a second general conductivity type formed on the semiconductor substrate;
    a first buried layer of the second general conductivity type formed between the semiconductor substrate and the epitaxial layer;
    a second buried layer of the first general conductivity type connected to a peripheral edge region of the first buried layer and extending from inside the semiconductor substrate into the epitaxial layer;
    a third buried layer of the first general conductivity type connected to a center region of the first buried layer and extending from top and bottom surface portions of the first buried layer into the epitaxial layer and the semiconductor substrate respectively;
    a first drawing layer and a second drawing layer of the first general conductivity type each extending from a surface portion of the epitaxial layer into the epitaxial layer so as to be connected to the second buried layer and the third buried layer respectively;
    a first diffusion layer of the first general conductivity type extending from a surface portion of the epitaxial layer into the epitaxial layer and connected to the second drawing layer so as to be surrounded by the second buried layer and the first drawing layer in plan view of the semiconductor substrate, the first buried layer covering a bottom portion of the first diffusion layer;
    a second diffusion layer of the second general conductivity type connected to and surrounding the first diffusion layer in the plan view;
    a cathode electrode connected to the first diffusion layer and the second diffusion layer; and
    an anode electrode connected to the first drawing layer,
    wherein the first buried layer and the second buried layer are configured to form a PN junction diode,
    the third buried layer, the epitaxial layer and the second buried layer are configured to form a parasitic bipolar transistor, and
    the PN junction diode and the parasitic bipolar transistor are configured to form an ESD protection element.

2. The semiconductor device of claim 1, wherein in the parasitic bipolar transistor, the third buried layer operates as an emitter, the epitaxial layer operates as a base, and the second buried layer operates as a collector.

3. The semiconductor device of claim 1, wherein the first buried layer of the PN junction diode has an impurity concentration higher than an impurity concentration of the epitaxial layer and lower than an impurity concentration of the second buried layer at least in a region adjacent to the second buried layer.

4. The semiconductor device of claim 1, wherein the cathode electrode is connected to a power supply line and the anode electrode is connected to a ground line.

5. The semiconductor device of claim 1, wherein an impurity concentration of the first buried layer is higher than an impurity concentration of the second buried layer except in a region of the first buried layer adjacent to the second buried layer where a breakdown voltage of the PN junction diode is determined.

6. The semiconductor device of claim 1, wherein a plurality of ESD protection elements are formed in a grid pattern in parallel.

* * * * *